(12) United States Patent
Singh et al.

(10) Patent No.: US 10,453,605 B2
(45) Date of Patent: Oct. 22, 2019

(54) INSULATING INDUCTOR CONDUCTORS WITH AIR GAP USING ENERGY EVAPORATION MATERIAL (EEM)

(71) Applicant: GLOBALFOUNDRIES INC., Grand Cayman (KY)

(72) Inventors: Sunil K. Singh, Mechanicville, NY (US); Jagar Singh, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 184 days.

(21) Appl. No.: 15/729,992

(22) Filed: Oct. 11, 2017

(65) Prior Publication Data
US 2019/0108942 A1    Apr. 11, 2019

(51) Int. Cl.
| | |
|---|---|
| *H01F 5/00* | (2006.01) |
| *H01F 41/063* | (2016.01) |
| *H01F 41/12* | (2006.01) |
| *H01F 5/06* | (2006.01) |
| *H01F 41/34* | (2006.01) |

(Continued)

(52) U.S. Cl.
CPC ............ *H01F 41/063* (2016.01); *H01F 5/00* (2013.01); *H01F 5/003* (2013.01); *H01F 5/06* (2013.01); *H01F 17/0006* (2013.01); *H01F 41/042* (2013.01); *H01F 41/12* (2013.01); *H01F 41/34* (2013.01); *H01L 21/00* (2013.01);

(Continued)

(58) Field of Classification Search
CPC ............................ H01F 5/00; H01F 27/00–36

USPC ............. 336/65, 83, 200, 206–208, 232
See application file for complete search history.

(56) References Cited

U.S. PATENT DOCUMENTS

| | | |
|---|---|---|
| 7,125,782 B2 | 10/2006 | Knorr et al. |
| 7,566,627 B2 | 7/2009 | Matz et al. |

(Continued)

FOREIGN PATENT DOCUMENTS

KR    20000011253 A  *  2/2000  ....... H01L 21/02164

OTHER PUBLICATIONS

Chen et al., "A Deep Submicron CMOS Process Compatible Suspending High-Q Inductor", IEEE Electron Device Letters, vol. 22, No. 11, Nov. 2001, pp. 522-523.

(Continued)

*Primary Examiner* — Tuyen T Nguyen
(74) *Attorney, Agent, or Firm* — Gibb & Riley, LLC; Anthony J. Canale

(57) ABSTRACT

A first layer on a substrate includes an insulator material portion adjacent an energy-reactive material portion. The energy-reactive material portion evaporates upon application of energy during manufacturing. Processing patterns the first layer to include recesses extending to the substrate in at least the energy-reactive material portion. The recesses are filled with a conductor material, and a porous material layer is formed on the first layer and on the conductor material. Energy is applied to the porous material layer to: cause the energy to pass through the porous material layer and reach the energy-reactive material portion; cause the energy-reactive material portion to evaporate; and fully remove energy-reactive material portion from an area between the substrate and the porous material layer, and this leaves a void between the substrate and the porous material layer and adjacent to the conductor material.

14 Claims, 5 Drawing Sheets

(51) Int. Cl.
*H01F 17/00* (2006.01)
*H01F 41/04* (2006.01)
*H01L 21/00* (2006.01)
*H01L 49/02* (2006.01)

(52) U.S. Cl.
CPC ........ *H01L 28/10* (2013.01); *H01F 2005/006* (2013.01); *H01F 2017/0073* (2013.01)

(56) References Cited

U.S. PATENT DOCUMENTS

| | | |
|---|---|---|
| 7,662,722 B2 | 2/2010 | Stamper et al. |
| 7,682,963 B2 | 3/2010 | Chen et al. |
| 8,519,482 B2 | 8/2013 | Yu et al. |
| 8,896,120 B2 | 11/2014 | Clevenger et al. |
| 9,142,451 B2 | 9/2015 | Singh et al. |
| 9,208,938 B2 | 12/2015 | Ding et al. |
| 9,362,162 B2 | 6/2016 | Singh et al. |
| 2005/0037604 A1 | 2/2005 | Babich et al. |
| 2008/0173976 A1 | 7/2008 | Stamper et al. |
| 2015/0200160 A1 | 7/2015 | Su et al. |

OTHER PUBLICATIONS

Park et al., "High Q Spiral-Type Microinductors on Silicon Substrates", IEEE Transactions on Magnetics, vol. 35, No. 5, Sep. 1999, pp. 3544-3546.

\* cited by examiner

INSULATING INDUCTOR CONDUCTORS WITH AIR GAP USING ENERGY EVAPORATION MATERIAL (EEM)

BACKGROUND

Field of the Invention

The present disclosure relates to the formation of insulators for conductors, and more specifically, to insulating conductors of an inductor with an air gap, using energy evaporation material (EEM) during processing.

Description of Related Art

Integrated circuit devices are formed of many layers; and within such layers, various active, switching devices (e.g., transistors, etc.) and passive, non-switching devices (e.g., inductors, capacitors, etc.) are present. Passive elements are highly useful in analog and radio-frequency (RF) systems, and are used for matching networks, inductor-capacitor (LC) tank circuits, attenuators, filters, decoupling capacitors, loads, on-die antennas, antenna reflectors, etc. For example, inductors are one of the most used elements in RF and microwave circuits for high-frequency wireless applications.

One measure of the sharpness of resonant circuits is termed "Q" (which is dimensionless) and is the reactance of the inductor divided by AC or RF resistance, plus the DC resistance of the windings. If the Q is too low, the lumped circuit will not reach the desired performance targets. Spiral inductors providing a high Q and inductance value are commonly in demand for wireless System-on-chip (SoC) or radio frequency integrated circuits (RFIC). To obtain high performance, inductor parasitic losses of inductors should be minimized.

SUMMARY

According to one embodiment herein, a first layer is formed on a substrate to include an insulator material portion adjacent an energy-reactive material portion. The energy-reactive material portion evaporates upon application of energy during manufacturing. The first layer is patterned to include recesses extending to the substrate in at least the energy-reactive material portion, and possibly in the insulator material portion. The recesses are filled with a conductor material extending from the substrate to a top of the insulator material portion. The patterning process shapes the recesses to form an inductor structure in the energy-reactive material portion and to form electrical connectors separate from the inductor structure in the insulator material portion. A porous material layer is formed on the first layer and on the conductor material.

Energy is applied to the porous material layer to: cause the energy to pass through the porous material layer and reach the energy-reactive material portion; cause the energy-reactive material portion to evaporate; and fully remove the energy-reactive material portion from an area between the substrate and the porous material layer and leave a void between the substrate and the porous material layer and adjacent to the inductor structure. The void that is formed is the same height between the substrate and the porous material layer as the inductor structure. Further, the insulator material portion and the conductor material provide mechanical support for the void.

Such processing produces an integrated circuit structure that includes (among other features) a first layer on a substrate, and a porous material layer on the first layer. The first layer includes first electrical conductors forming an inductor structure, a void surrounding the inductor structure, and an insulator material portion bordering the void. The insulator material portion includes second electrical conductors forming electrical connectors separate from the inductor structure. Also, the void extends between the substrate and the porous material layer and adjacent to the inductor structure. Further, the void is the same height between the substrate and the porous material layer as the inductor structure. The insulator material portion, the first electrical conductors, and the second electrical conductors provide mechanical support for the void.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, to obtain high performance, parasitic losses of inductors should be minimized. The systems and methods herein address these issues by forming air gaps between inductor lines.

Figure 1:
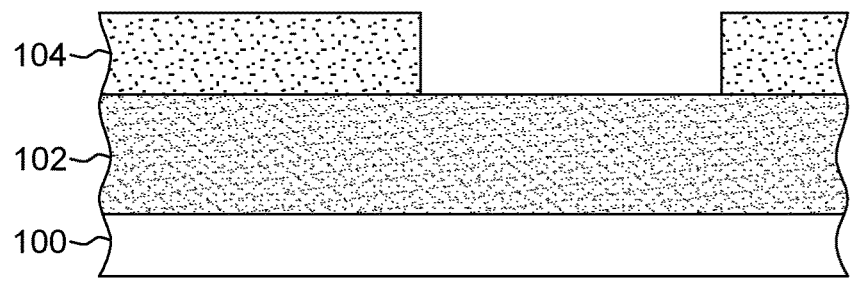
FIGS. 1-11 are schematic diagrams illustrating cross-sectional views of different processing steps performed to create devices produce by methods herein.

FIGS. 1-11 are schematic diagrams illustrating cross-sectional views of different processing steps performed to create devices produce by methods herein. As shown in FIG. 1, a first layer 102 is formed on a substrate 100. The substrate 100 can be any suitable conventional material, such as a bulk wafer substrate, a ceramic substrate, etc. Similarly, the first layer 102 can be any form of insulator. For purposes herein, an insulator or dielectric is a relative term that means a material or structure that allows substantially less (<95%) electrical current to flow than does a "conductor." The dielectrics (insulators) mentioned herein can, for example, be grown from either a dry oxygen ambient or steam, and then patterned. Alternatively, the dielectrics herein may be formed from any of the many candidate high dielectric constant (high-k) materials, including but not limited to silicon nitride, silicon oxynitride, a dielectric stack of $SiO_2$ and $Si_3N_4$, metal oxides like tantalum oxide, etc. The thickness of dielectrics herein may vary contingent upon the required device performance.

Figure 2:
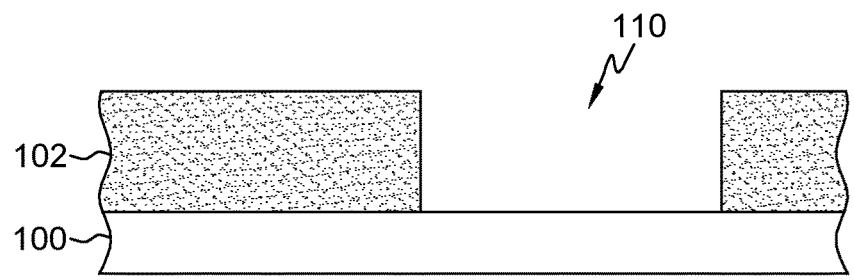

As also shown in FIG. 1, a mask 104 is patterned on the first layer 102. Subsequently, the mask 104 is used to pattern the first layer 102 to remove a portion of the first layer and leave an opening 110, as shown in FIG. 2. When patterning any material herein, the material to be patterned can be grown or deposited in any known manner, and a patterning layer (such as an organic photoresist, e.g., 104)) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned, and which portion of the resist that is rinsed off depends upon whether the resist is a negative resist (illuminated portions remain) or positive resist (illuminated portions are rinsed off).

A material removal process is then performed through the mask (e.g., plasma etching, etc.) to remove the unprotected portions of the material below the resist to be patterned (e.g., 102). The resist is subsequently removed to leave the underlying material patterned according to the light exposure pattern (or a negative image thereof), as shown in FIG. 2.

Figure 3:
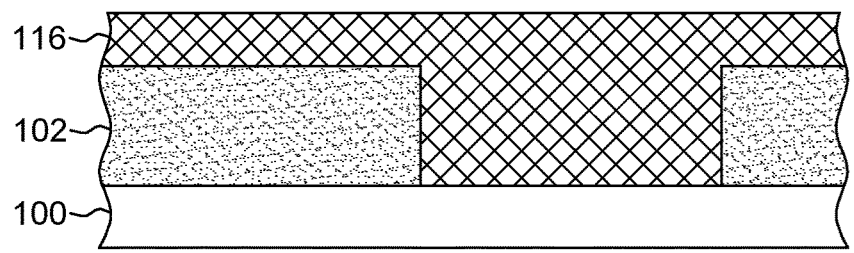
Figure 4:
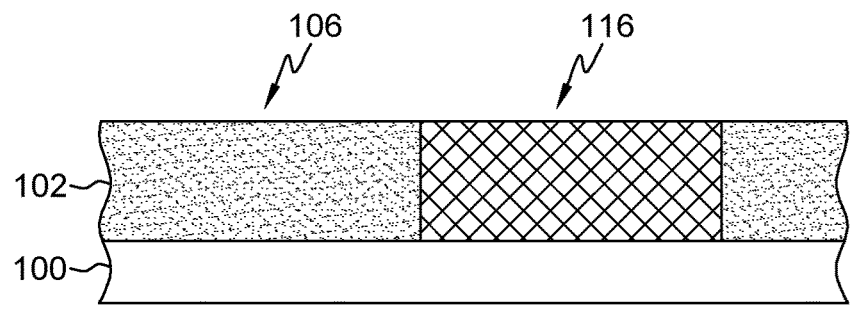

FIG. 3 illustrates the formation of an energy-reactive material 116 in the opening 110 and on the first layer 102. FIG. 4 illustrates a subsequent planarization process (e.g., chemical-mechanical polishing (CMP), etc.) that leaves the energy-reactive material portion 116 only where the opening 110 previously existed. Therefore, as shown in FIG. 4, the first layer 102 is formed on the substrate 100 to include an insulator material portion 106 adjacent an energy-reactive material portion 116.

The energy-reactive material portion 116 can be an energy evaporation material (EEM) made of a carbon-based compound or a silicon-based CxHy compound. The energy-reactive material portion 116 evaporates upon application of energy during manufacturing. More specifically, the energy-reactive material is a material that melts and evaporates (or vaporizes) upon being exposed to proper energy such as ultraviolet (UV), X-ray, infrared, visual light, thermal energy, electron-beam (e-beam), and/or other proper energy sources. For example, one energy-reactive material is evaporated using ultraviolet light (and therefore, the energy-reactive material portion 116 is sometimes referred to herein as an ultraviolet light-reactive material portion 116). The energy-reactive material can therefore be a photonic-reacting material, a thermal-reacting material, an e-beam-reacting material, an ultraviolet-reacting material, etc., or any combination of the foregoing. In one example, the energy-reactive material can be an organic compound, or can be a silicon-based CxHy compound. Further, the energy-reactive material may be formed by a suitable process such as chemical vapor deposition (CVD).

Figure 5:
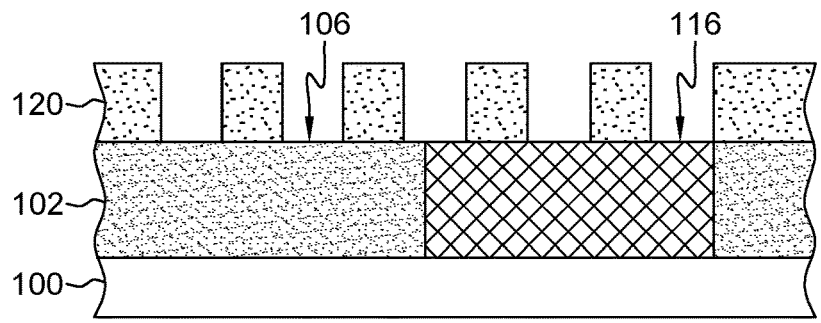
Figure 6:
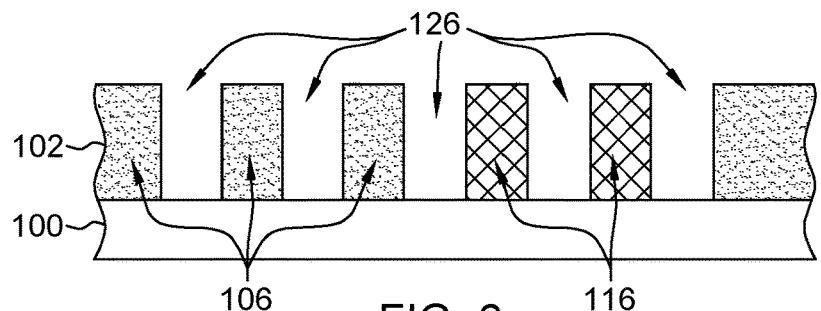

As shown in FIG. 5, a second mask 120 is patterned over the first layer 102 (the insulator material portion 106 and the energy-reactive material portion 116). As shown in FIG. 6, the first layer 102 is patterned using the second mask 120 to form recesses 126 extending to the substrate 100 in at least the energy-reactive material portion 116, and possibly in the insulator material portion 106. The mask 120 is removed, for example in a carbon monoxide, carbon dioxide stripping process.

Figure 7:
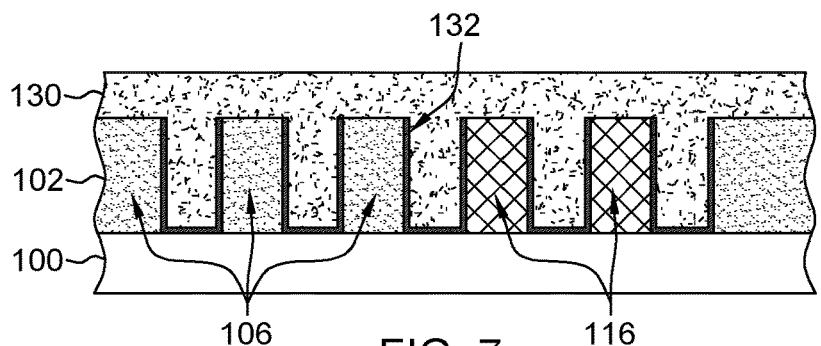

A barrier layer or liner 132 (e.g., metal, such as Ta, TaN, Co, Ru, etc.) is optionally formed/deposited along the recesses 126 to protect the substrate 100 and insulator 102 from any unwanted contamination, diffused impurities, etc., from later-formed conductors. More specifically, the liner 132 lines the recesses 126, without filling the recesses; and, therefore, the liner has a thickness that is less than 10%, 5%, 1%, etc., of the width of the recesses 126. Following the liner 132, the recesses 126 are then filled with a conductor material 130 that is deposited or grown on the liner 132 (or grown directly on the substrate 100, if a liner 132 is not used) as shown in FIG. 7.

The conductors mentioned herein can be formed of any conductive material, such as polycrystalline silicon (poly-silicon), amorphous silicon, a combination of amorphous silicon and polysilicon, and polysilicon-germanium, rendered conductive by the presence of a suitable dopant, etc. Alternatively, the conductors herein may be one or more metals, such as copper, tungsten, hafnium, tantalum, molybdenum, titanium, or nickel, or a metal silicide, any alloys of such metals, and may be deposited using physical vapor deposition, chemical vapor deposition, or any other technique known in the art.

Figure 8:
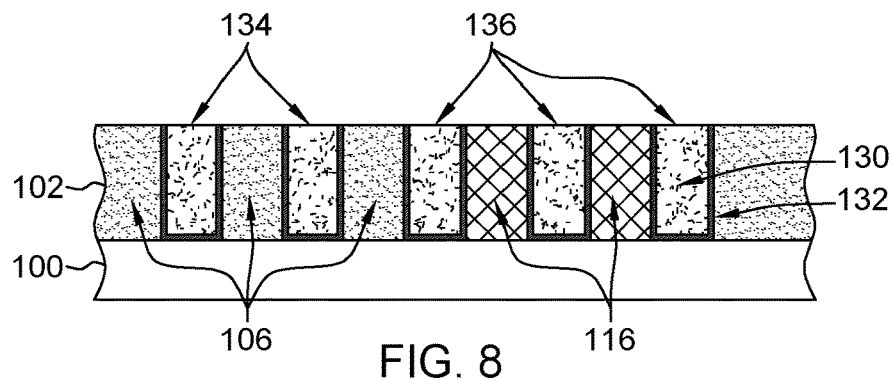

Excess conductor material 130 is planarized using CMP, etching, etc.; and therefore, the recesses 126 are lined with a liner 132 and filled with distinct portions of a conductor material 130 extending from the substrate 100 (or more technically from the liner 132 that contacts the substrate 100, if the liner 132 is present) to the top of the insulator material portion 106, as shown in FIG. 8. Note that this forms some conductors 134 in the insulator material portion 106 and other conductors 136 in the energy-reactive material portion 116, all of which are separated from one another by the insulator 102 and the energy-reactive material portion 116. In one example, the conductors 136 in the energy-reactive material portion 116 can be used as an inductor, while the conductors 134 in the insulator material portion 106 can be used for other structures (such as wires, conductive lines, etc.) separate from the inductor.

Figure 9:
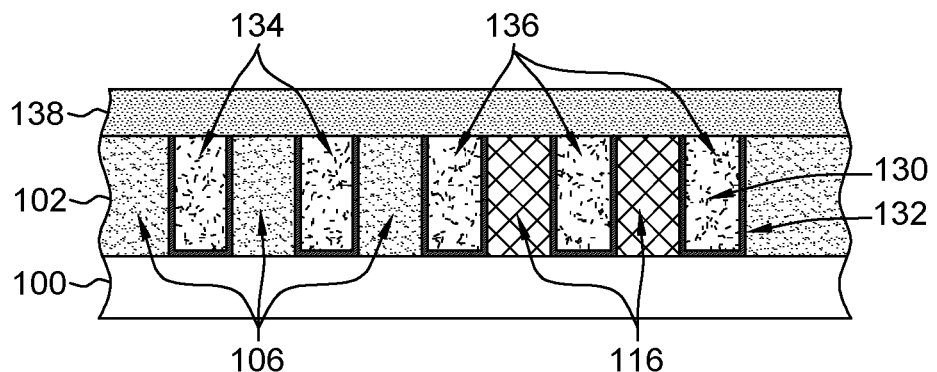

A porous material layer 138 is formed on the first layer 102 (the insulator material portion 106 and the energy-reactive material portion 116) and on the conductor material 130, as shown in FIG. 9. The porous material layer 138 can be any suitable porous material, such as an oxide layer or a nitride layer treated to have pores (where the pores are openings that extend from the energy-reactive material portion 116, through the porous material layer 138, to the other side of the porous material layer 138). In one example, after the oxide or nitride layer are formed, a burn-out process can be used to create a plurality of pores. Also, the oxide layer can be formed using a SOD process or a sol-gel process, where the SOD process is conducted using HSQ (hydrogen silsesquioxane), NH$_3$ and H$_2$O, and the sol-gel process is conducted using tetraethylorthosilicate (TEOS). The burn-out process can be conducted, for example, at a temperature of about 300-400° C., for about 5-30 minutes.

Energy is applied to the porous material layer 138. For example, the process of applying energy can include applying (shining, directing, outputting, generating, etc.) light energy (e.g., ultraviolet light, X-rays, infrared light, visible light, electron-beams (e-beam)) alone, or combined with thermal heating. The light energy travels through pores of the porous material layer 138 to reach the energy-reactive material portion 116, while simultaneously any heat supplied can be applied to the whole structure (e.g., the substrate 100, the porous material layer 138, the sides, etc.) and also reaches the energy-reactive material portion 116. This process of applying energy causes the light energy to pass through the porous material layer 138 and reach the energy-reactive material portion 116, which in turn causes the energy-reactive material portion 116 to melt/evaporate/vaporize and pass out from the area between the substrate 100 and the porous material layer 138 by passing through the porous material layer 138, as shown by arrows 140 in FIG. 10. Further, this energy application can fully remove the energy-reactive material portion 116 from the area between the substrate 100 and the porous material layer 138 (possibly with some trace remnants of the energy-reactive material portion 116 remaining (e.g., less than 5%, 3%, 1%, etc.)) to leave a void 142 between the substrate 100 and the porous material layer 138 only adjacent to the inductor structure.

After application of the energy to drive the energy-reactive material portion 116 through the porous material layer 138, this processing forms an insulator layer 146 on the porous material layer 138 to cap pores of the porous material layer 138 to seal the void 142. This keeps only air (or other gasses, or a partial vacuum) in the void 142, thereby creating a highly insulative air gap within the void 142.

Figure 10:
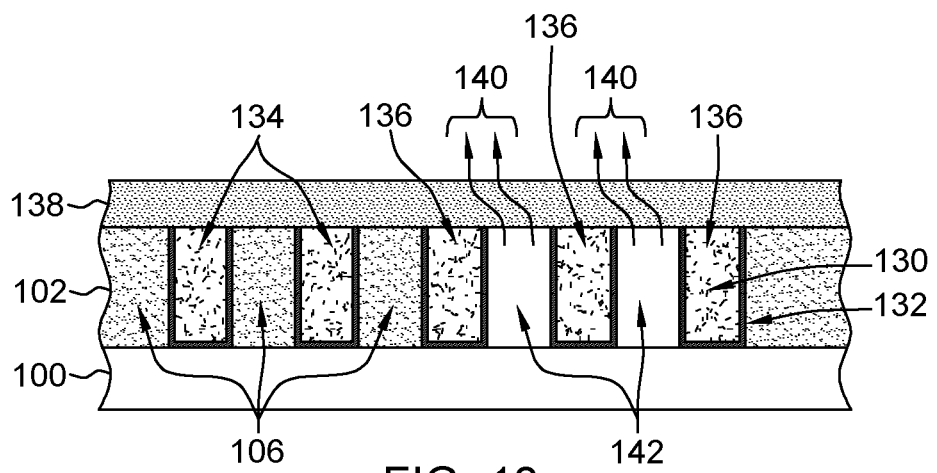
Figure 11:
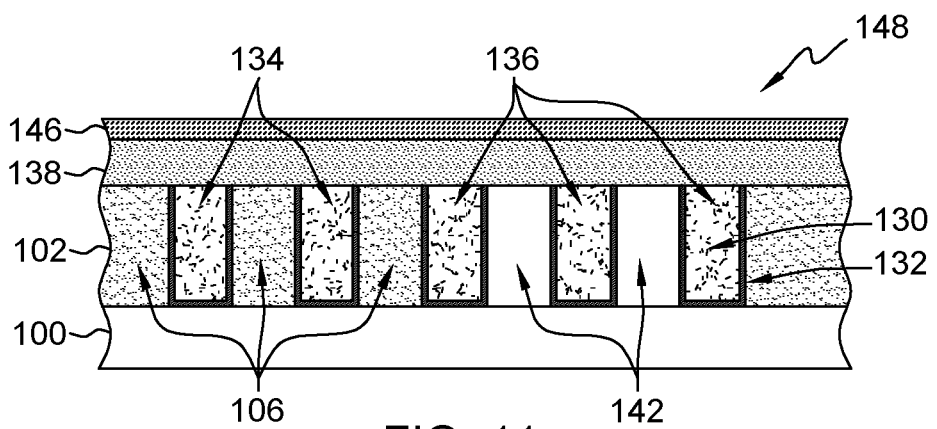
Figure 12:
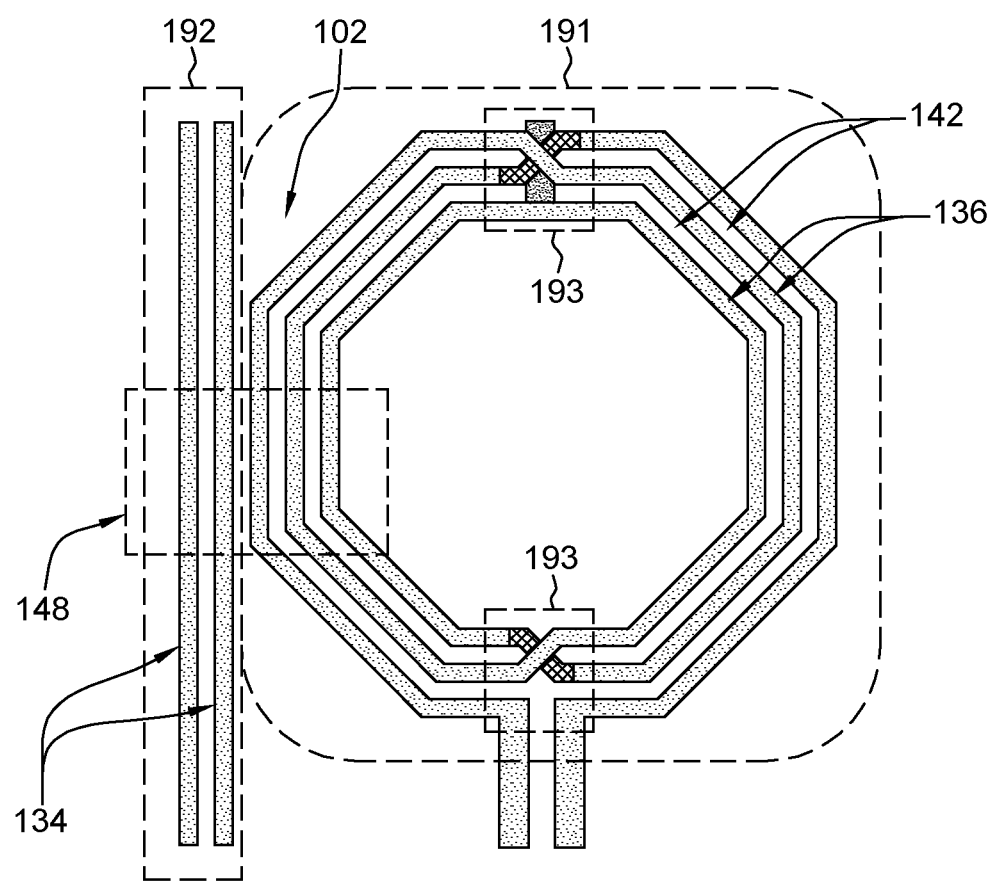
FIG. 12 is a top-view (plan view) schematic diagram illustrating devices produce by methods herein.

FIG. 12 shows a top view of an exemplary integrated circuit structure that can be formed as described above and that can include the area 148 as shown in the cross-section of FIG. 11. FIG. 12 also shows that the conductors 136 in the energy-reactive material portion 116 can be used as/patterned to form an inductor structure 191, while the conductors 134 in the insulator material portion 106 can be used for other conductive structure(s) 192 (e.g., electrical connectors), which are separate from the inductor structure 191. In some structures, the patterns in the patterning can be adjusted so that the void can be limited to regions 193, shown in FIG. 12. In other words, the patterning process shown in FIGS. 5 and 6 shapes recesses 126 into which conductors 136 of an inductor structure 191 and other conductors 134 of other conductive structure(s) 192 are formed. Furthermore, the application of energy as shown in FIG. 10 creates a void 142 (also referred to as an air gap), which electrically insulates the conductors 136 of the inductor structure 191. As illustrated, the conductors 134 of the other conductive structure(s) 192, which are separate from the inductor structure 191, are electrically insulated by the insulator material portion 106, instead of a void or air gap. The void 142 that is formed is the same height between the substrate 100 and the porous material layer 138 as the inductor structure. Further, the insulator material portion 106 and the conductor material 130 provide mechanical support for the void 142 preventing the void from collapse. In other words, the air gap insulator 142 is formed only between the conductors 136 of the inductor, and not between conductors 134 of immediately adjacent structures, allowing the other conductors 134 and the adjacent insulator portions 106 to provide structural support for the void(s) 142.

Therefore, as shown in FIGS. 11 and 12, such processing produces an integrated circuit structure that includes (among other features) a first layer 102 on a substrate 100, and a porous material layer 138 on the first layer 102. The first layer 102 includes first electrical conductors 136 forming an inductor structure 191, a void 142 that electrically insulates the conductors 136 of the inductor structure, and an insulator material portion 106 bordering the inductor structure 191. The insulator material portion 106 includes second electrical conductors 134 forming other conductive structure(s) 192 (e.g., electrical connectors), which are separate and electrically isolated from the inductor structure conductors 136. The first electrical conductors 136 and the second electrical conductors 134 are the same material. A liner 132 can be between the void 142 and the conductor material. The porous material layer 138 has pores capable of allowing ultraviolet light to pass through. The porous material layer 138 can be an oxide layer, a nitride layer, etc., having pores. Also, the void 142 extends between the substrate 100 and the porous material layer 138 and adjacent to the inductor structure conductors 136. Further, the void 142 is the same height between the substrate 100 and the porous material layer 138 as the inductor structure conductors 136. The insulator material portion 106, the first electrical conductors 136, and the second electrical conductors 134 provide mechanical support for the void 142. An insulator layer on the porous material layer 138 caps pores of the porous material layer 138 to seal the void 142.

Figure 13:
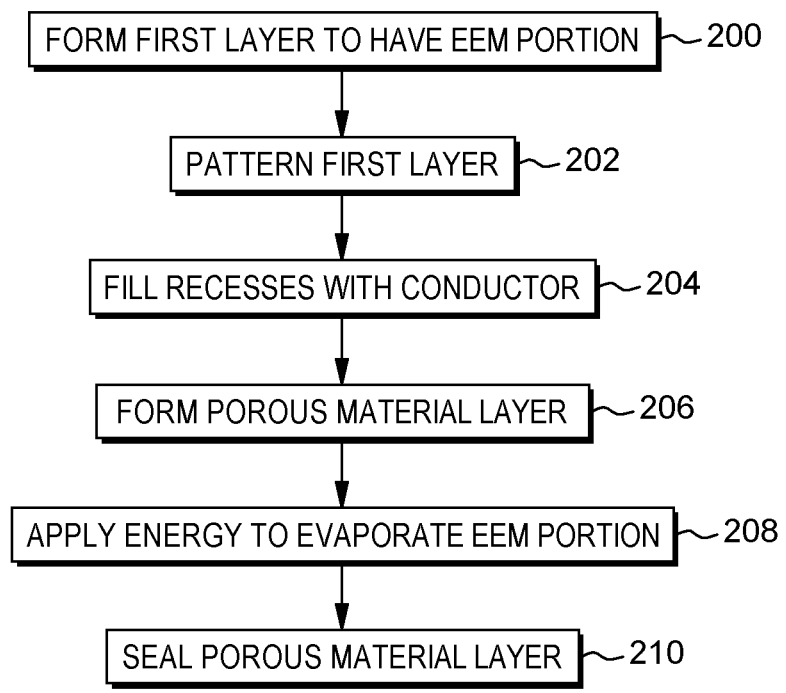
FIG. 13 is a flow diagram illustrating embodiments herein.

FIG. 13 is a flowchart illustrating some aspects of some methods herein. More specifically, FIG. 13 illustrates that, with methods herein, a first layer is formed on a substrate to include an insulator material portion adjacent an energy-reactive material (energy evaporation material (EEM)) portion in item 200. The energy-reactive material portion evaporates upon application of energy during manufacturing.

The first layer is patterned to include recesses extending to the substrate in at least the energy-reactive material portion, and possibly in the insulator material portion in item 202. The recesses are filled with a conductor material extending from the substrate to the top of the insulator material portion in item 204. The patterning process in item 202 shapes the recesses so that, when the conductive material is deposited at process 204, an inductor structure is formed in the energy-reactive material portion and other conductive structure(s) (e.g., electrical connectors), which are separate from the inductor structure, are formed in the insulator material portion. A porous material layer is formed on the first layer and on the conductor material in item 206.

Energy is applied to the porous material layer in item 208 to: cause the energy to pass through the porous material layer and reach the energy-reactive material portion; cause the energy-reactive material portion to evaporate, thereby fully removing the energy-reactive material portion from an area between the substrate and the porous material layer and leaving a void between the substrate and the porous material layer and adjacent to the inductor structure. The void that is formed is the same height between the substrate and the porous material layer as the inductor structure. Further, the insulator material portion and the conductor material provide mechanical support for the void. An insulator layer that seals/caps the porous material layer is then formed in item 210. Additional processing can be performed to form contacts, additional layers of devices, etc.

While only one or a limited number of inductors are illustrated in the drawings, those ordinarily skilled in the art would understand that many different types inductor could be simultaneously formed with the embodiment herein and the drawings are intended to show simultaneous formation of multiple different types of inductors; however, the drawings have been simplified to only show a limited number of inductors for clarity and to allow the reader to more easily recognize the different features illustrated. This is not intended to limit this disclosure because, as would be understood by those ordinarily skilled in the art, this disclosure is applicable to structures that include many of each type of inductor shown in the drawings.

The flowchart and block diagrams in the figures illustrate the architecture, functionality, and operation of possible implementations of devices and methods according to various embodiments. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. A method comprising:
   forming a first layer on a substrate to include an insulator material portion adjacent an energy-reactive material portion, wherein the energy-reactive material portion evaporates upon application of energy during manufacturing;
   patterning the first layer to include recesses extending to the substrate in at least the energy-reactive material portion;
   filling the recesses with a conductor material extending from the substrate to a top of the insulator material portion;
   forming a porous material layer on the first layer and on the conductor material; and
   applying energy to the porous material layer to: cause the energy to pass through the porous material layer and reach the energy-reactive material portion; cause the energy-reactive material portion to evaporate; and fully remove the energy-reactive material portion from an area between the substrate and the porous material layer and leave a void between the substrate and the porous material layer and adjacent to the conductor material, wherein the void is the same height between the substrate and the porous material layer as the conductor material.

2. The method according to claim 1, wherein the energy-reactive material portion comprises an energy evaporation material (EEM) comprising a carbon-based compound or silicon-based CxHy compound.

3. The method according to claim 1, wherein the applying energy comprises applying light energy through pores of the porous material layer while simultaneously applying heat to the substrate and the porous material layer.

4. The method according to claim 1, further comprising forming an insulator layer on the porous material layer to cap pores of the porous material layer to seal the void.

5. The method according to claim 1, further comprising forming a liner along the recesses before the filling of the recesses with the conductor material.

6. The method according to claim 1, wherein the porous material layer comprises at least one of an oxide layer and a nitride layer treated to have pores.

7. The method according to claim 1, wherein a process of forming the first layer comprises:
   supplying the first layer comprising the insulator material portion;
   patterning the first layer to create openings for the energy-reactive material portion; and
   depositing the energy-reactive material portion in the openings.

8. A method comprising:

forming a first layer on a substrate to include an insulator material portion adjacent an ultraviolet light-reactive material portion, wherein the ultraviolet light-reactive material portion evaporates upon application of ultraviolet light during manufacturing;

patterning the first layer to include recesses extending to the substrate in the insulator material portion and the ultraviolet light-reactive material portion;

filling the recesses with a conductor material extending from the substrate to a top of the insulator material portion, wherein the patterning shapes the recesses to form an inductor structure in the ultraviolet light-reactive material portion and to form electrical connectors separate from the inductor structure in the insulator material portion;

forming a porous material layer on the first layer and on the conductor material; and applying ultraviolet light to the porous material layer to:
  cause the ultraviolet light to pass through the porous material layer and reach the ultraviolet light-reactive material portion; and
  cause the ultraviolet light-reactive material portion to evaporate, fully removing the ultraviolet light-reactive material portion from an area between the substrate and the porous material layer and leaving a void between the substrate and the porous material layer and adjacent to the inductor structure, wherein the void is the same height between the substrate and the porous material layer as the inductor structure, and wherein the insulator material portion and the conductor material provide mechanical support for the void.

9. The method according to claim 8, wherein the ultraviolet light-reactive material portion comprises an ultraviolet light evaporation material (EEM) comprising a carbon-based compound or silicon-based $C_xH_y$ compound.

10. The method according to claim 8, wherein the applying ultraviolet light comprises applying light ultraviolet light through pores of the porous material layer while simultaneously applying heat to the substrate and the porous material layer.

11. The method according to claim 8, further comprising forming an insulator layer on the porous material layer to cap pores of the porous material layer to seal the void.

12. The method according to claim 8, further comprising forming a liner along the recesses before the filling of the recesses with the conductor material.

13. The method according to claim 8, wherein the porous material layer comprises at least one of an oxide layer and a nitride layer treated to have pores.

14. The method according to claim 8, wherein a process of forming the first layer comprises:

supplying the first layer comprising the insulator material portion;

patterning the first layer to create openings for the ultraviolet light-reactive material portion; and depositing the ultraviolet light-reactive material portion in the openings.

* * * * *